United States Patent
Vogtmeier

(10) Patent No.: US 8,492,653 B2
(45) Date of Patent: Jul. 23, 2013

(54) CONNECTOR FOR ESTABLISHING AN ELECTRICAL CONNECTION WITH CONDUCTIVE TAPE

(75) Inventor: Gereon Vogtmeier, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 290 days.

(21) Appl. No.: 12/922,720

(22) PCT Filed: Mar. 12, 2009

(86) PCT No.: PCT/IB2009/051029
§ 371 (c)(1),
(2), (4) Date: Sep. 15, 2010

(87) PCT Pub. No.: WO2009/115953
PCT Pub. Date: Sep. 24, 2009

(65) Prior Publication Data
US 2011/0005830 A1    Jan. 13, 2011

(30) Foreign Application Priority Data
Mar. 19, 2008 (EP) .................... 08102743

(51) Int. Cl.
*H01R 4/24* (2006.01)
(52) U.S. Cl.
USPC ....................................... 174/84 R
(58) Field of Classification Search
USPC .... 174/84, 250, 252, 260 R; 439/91; 361/741
See application file for complete search history.

(56) References Cited

U.S. PATENT DOCUMENTS

| | | | | |
|---|---|---|---|---|
| 2,724,216 A | * | 11/1955 | Cisne | 65/56 |
| 3,483,027 A | * | 12/1969 | Mache | 216/52 |
| 3,488,027 A | * | 1/1970 | Evans | 249/175 |
| 6,224,396 B1 | | 5/2001 | Chan et al. | |
| 2001/0005636 A1 | * | 6/2001 | Nishizawa | 438/710 |
| 2001/0015283 A1 | | 8/2001 | Sexton | |
| 2003/0092293 A1 | | 5/2003 | Ohtsuki et al. | |
| 2003/0227592 A1 | | 12/2003 | Izumi et al. | |
| 2008/0017873 A1 | | 1/2008 | Tomoda et al. | |

FOREIGN PATENT DOCUMENTS

| | | |
|---|---|---|
| DE | 102005055695 A1 | 5/2007 |
| EP | 237176 * | 5/1987 |
| EP | 1020505 B1 | 7/2000 |
| EP | 1816653 A1 | 8/2007 |
| WO | 0220686 A2 | 3/2002 |
| WO | WO 0220686 * | 3/2002 |
| WO | WO 0220686 A2 * | 3/2002 |
| WO | 2006117717 A2 | 11/2006 |

\* cited by examiner

*Primary Examiner* — Jeremy Norris
*Assistant Examiner* — Paresh Paghadal
(74) *Attorney, Agent, or Firm* — Mark Beloborodov; David Zivan

(57) ABSTRACT

Provided is a connector (200; 700) for establishing an electrical connection with a conductive tape (100). The conductive tape comprises at least a first conducting layer (104) and an insulating layer (102). The connector comprises a first conductive region (204; 710) and a first connection region (712). The first connection region (712) is adapted to establish an electrical connection between the first conducting layer (104) of the conducting tape and the first conductive region (204; 110) when a perturbation is applied. The perturbation may be the application of pressure or temperature to the connector.

13 Claims, 5 Drawing Sheets

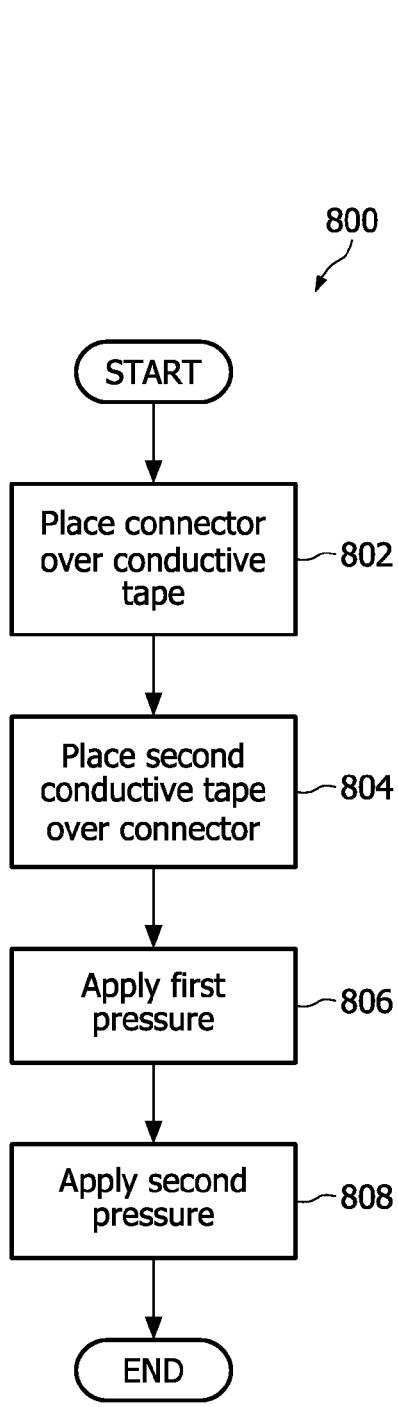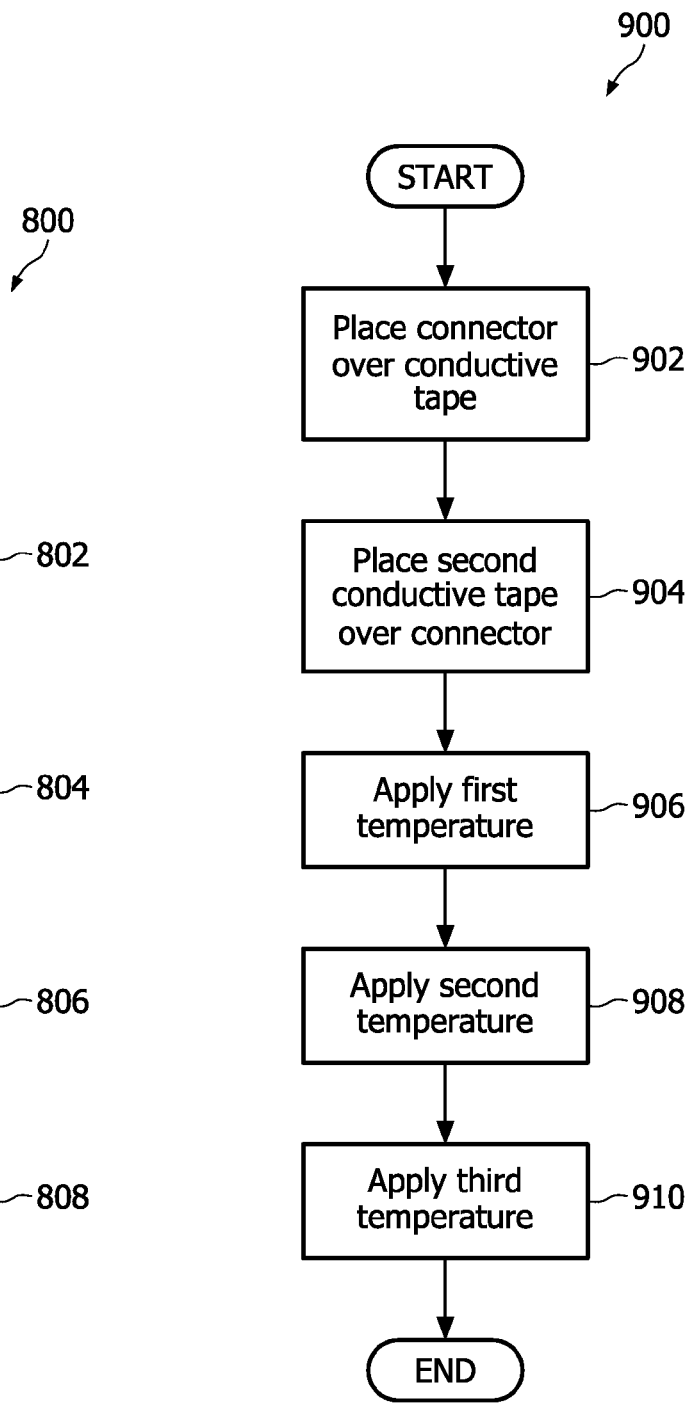
FIG. 8
FIG. 9

CONNECTOR FOR ESTABLISHING AN ELECTRICAL CONNECTION WITH CONDUCTIVE TAPE

FIELD OF THE INVENTION

The invention relates to the field of electrical cabling and more specifically to a connector, a method for establishing a connection and a tool for establishing a connection with conductive tape.

BACKGROUND OF THE INVENTION

LED lighting technology presents new possibilities for lighting. LEDs can be used to light homes and other locations in new and creative ways. LEDs typically require a supply voltage which is lower than a mains supply voltage. The transmission of power to LED devices can limit the ways in which LEDs can be used for lighting.

EP 1020505 discloses an electrically conductive adhesive tape which has regions which are anisotropically conductive in the direction of the thickness of the tape.

SUMMARY OF THE INVENTION

According to an embodiment of the present invention, there is provided a connector for establishing an electrical connection with a conductive tape. The conductive tape comprises at least a first conducting layer and an insulating layer. The connector comprises a first conductive region and a first connection region. The first connection region is adapted to establish an electrical connection with the first conducting layer of the conductive tape when a perturbation is applied.

Embodiments of the presentation allow electrical connections to be made with conductive tapes. The conductive tapes may for example be located under wallpaper, or may be integrated into wall paper. Embodiments of the presentation therefore provide a way to integrate LED lighting into a home, office or similar environment with minimal structural disturbance to that environment.

According to an embodiment of the present invention, the perturbation comprises a first perturbation and a second perturbation. The first perturbation and the second perturbation may be applications or temperature or pressure to the connector.

According to an embodiment of the present invention, the first connection region has a plurality of needles and the perturbation is the application of pressure to the connector. This causes the needles to pierce the insulating layer of the conductive tape and establish a connection with the conducting layer of the conductive tape.

According to an embodiment of the present invention, the first connection region comprises a first plurality of cells and the first plurality of cells contains an etching agent. When the first perturbation is applied to the connector placed over a conductive tape, the etching agent may then etch an opening the insulating layer of the conductive tape thus allowing an electrical connection to be made with the first conducting layer of the conductive tape.

According to an embodiment of the present invention, the first connection region comprises a second plurality of cells. The second plurality of cells contains a conductive epoxy, which may be released on the application of the second perturbation. The conductive epoxy once released establishes an electrical connection between the first conductive region of the connector and the first conducting layer of the conductive tape.

According to an embodiment of the present invention, the first connection region comprises a third plurality of cells. The third plurality of cells contains an insulating material, which sets once released to provide electrical insulation of the connection established between the first conduction region of the connector and the first conducting layer of the conductive tape.

The first connection region may be on the periphery of the first conductive region. Alternatively, the first connection region may overlap first conduction region.

According to an embodiment of the present invention, the connector may comprise a second conductive region and a second connection region.

According to an embodiment of the present invention, there is provided a method for establishing an electrical connection with a conductive tape. The conductive tape comprises at least a first conducting layer and an insulating layer. The method comprises placing a connector over the conductive tape and applying a first perturbation.

According to an embodiment of the present invention, the method further comprises applying a second perturbation.

According to an embodiment of the present invention, the method further comprises placing a further conductive tape over the connector.

Embodiments of the present invention allow a further conductive tape to be connected to a conductive tape.

According to an embodiment of the present invention, the first and second perturbations are the application of pressure to the connector.

According to an embodiment of the present invention, the first and second perturbations are the application of temperature to the connector.

According to an embodiment of the present invention, there is provided a tool for establishing an electrical connection with a conductive tape. The conductive tape comprises at least a first conducting layer and an insulating layer. The tool comprises means for and applying a first perturbation.

According to an embodiment of the present invention, the tool further comprises means for applying a second perturbation.

According to an embodiment of the present invention, the tool further comprises means for measuring an electrical property of the connection.

These and other aspects of the invention will be apparent from and elucidated with reference to the embodiments described hereafter.

BRIEF DESCRIPTION OF THE DRAWINGS

In the following, embodiments of the invention will be described, in greater detail, by way of example only, making reference to the drawings in which:

FIG. 8 shows a flow diagram illustrating the steps in a method of establishing a connection with a conductive tape, FIG. 9 shows a flow diagram illustrating the steps in a method of establishing a connection with a conductive tape.

DETAILED DESCRIPTION OF EMBODIMENTS

Figure 1:
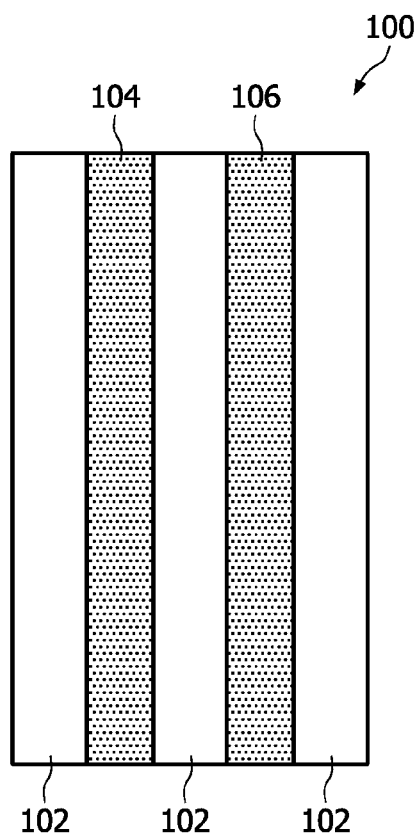
FIG. 1 shows a conductive tape.

FIG. 1 shows conductive tape 100. Conductive tape 100 has insulating layer 102 which encloses first conducting layer 104 and second conducting layer 106. First conducting layer 104 and second conducting layer 106 may be metal foil such as copper layers. Insulating layer 102 may be a laminated plastic layer laminated around first conducting layer 104 and second conducting layer 106. Conductive tape 100 may be used in the supply of power to LED lighting devices. Conductive tape may be realized as a thin conducting cable. Conductive tape 100 may be mounted on a wall under wallpaper. Conductive tape may be formed as an integral part of wallpaper for mounting on a wall.

Figure 2:
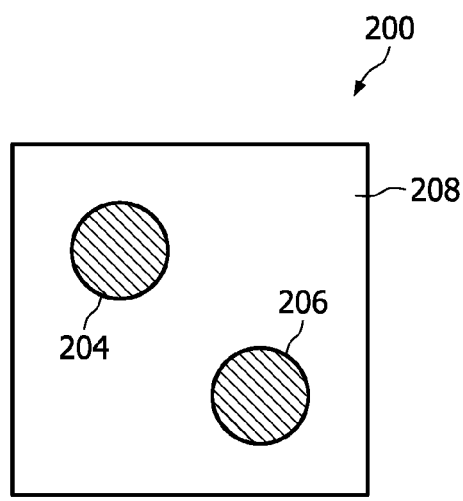
FIG. 2 shows a connector.

FIG. 2 shows connector 200 for establishing an electrical connection with a conductive tape such as that shown in FIG. 1. Connector 200 comprises first conductive region 204 and second conductive region 206. The first conductive region 204 and second conductive region 206 are mounted in insulating material 208. Connector 200 further comprises a first connection region, which may occupy the same area as first conductive region 204, and a second connection region, which may occupy the same area as second conductive region 206. The first connection region is adapted to establish an electrical connection between the first conduction region 204 and the first conducting layer of a conducting tape when a first perturbation is applied.

The term perturbation is used here to describe the application of an external change to the connector. Examples of perturbations include the application of a change in temperature and the application of a change in pressure to the connector.

First conductive region 204 and second conductive region 206 may have a plurality of needles or micro needles over their surfaces. When a pressure is applied to a connector placed over a conductive tape, the needles pierce the insulating layer and establish an electrical connection with the conducting layer of the conductive tape.

Figures 3, 4:
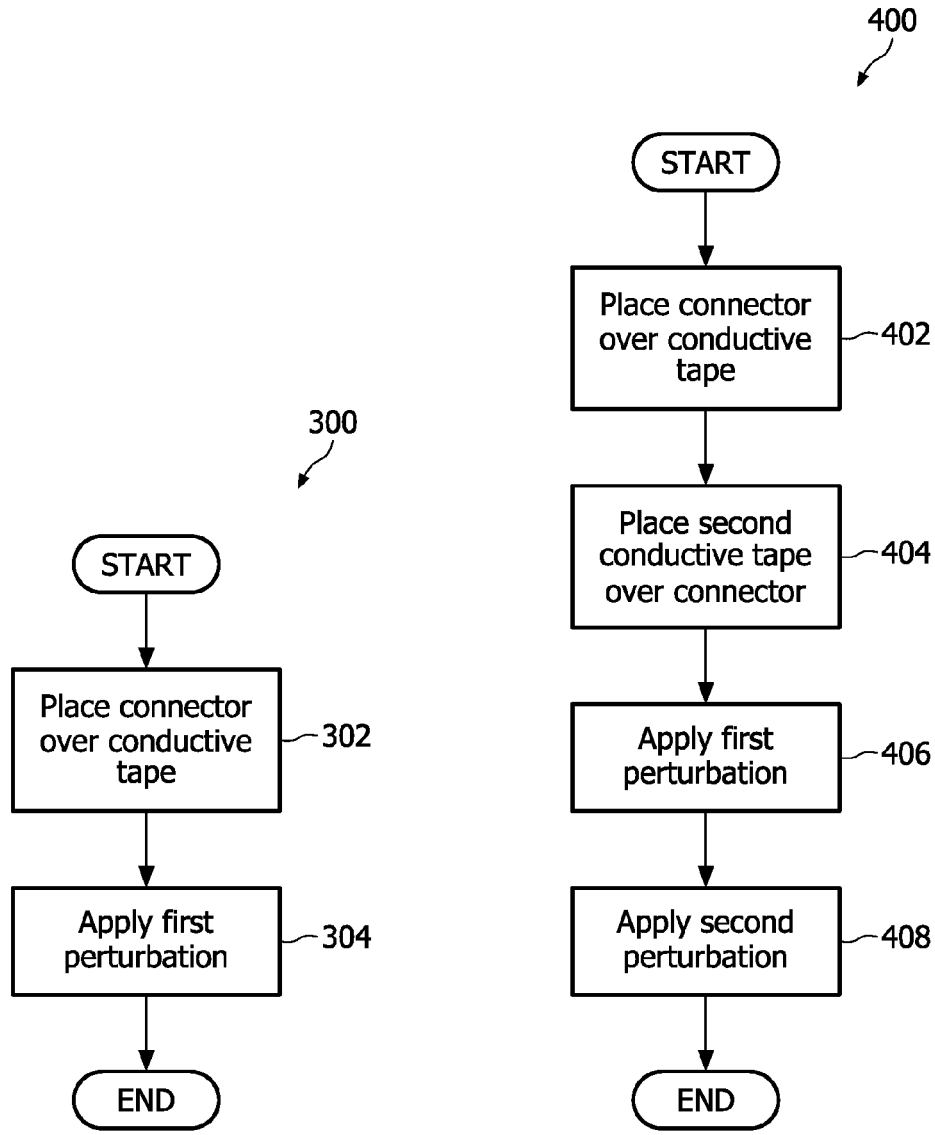
FIG. 3 shows a flow diagram illustrating the steps in a method of establishing a connection with a conductive tape.
FIG. 4 shows a flow diagram illustrating the steps in a method of establishing a connection with a conductive tape.

FIG. 3 shows a method 300 of establishing an electrical connection with a conductive tape. In step 302, a connector is placed over the conductive tape. In step 304, a first perturbation is applied to the connector. The first perturbation may be the application of a pressure or a change of temperature to the connector.

FIG. 4 shows a method 400 of establishing an electrical connection between a conductive tape and a further conductive tape. In step 402, a connector is placed over a conductive tape. In step 404, a further conductive tape is placed over the connector. In step 406, a first perturbation is applied. In step 408, a second perturbation is applied.

In the examples described below, the first and second perturbations are pressure or temperature, however, combinations of a pressure and temperature are possible, for example, the first perturbation may be the application of a pressure and the second perturbation may be the application of a temperature. Similarly, the first perturbation may be the application of a temperature and the second perturbation may be the application of a pressure.

Figure 5:
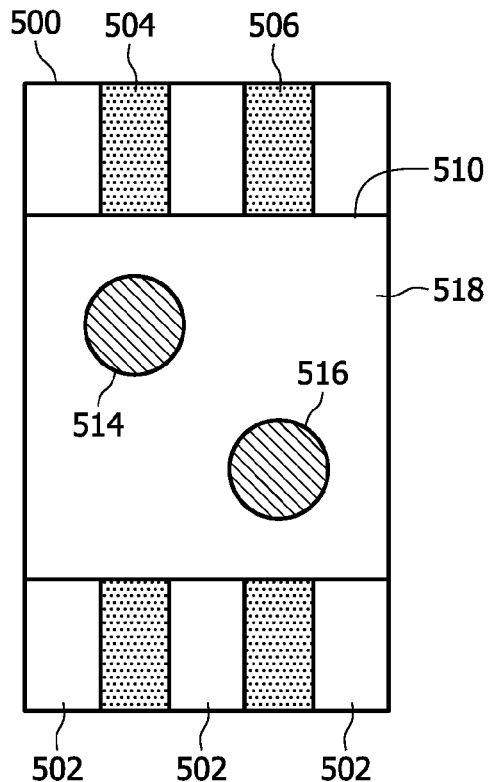
FIG. 5 shows the application of a connector to a conductive tape.

FIG. 5 shows the application of a connector 510 over a conductive tape 500. Conductive tape has insulating layer 502, first conducting layer 504 and second conducting layer 506. Connector 510 has first connection region 514 and second connection region 516. First connection region 514 and second connection region 516 are held in place by insulating material 518.

Figure 6:
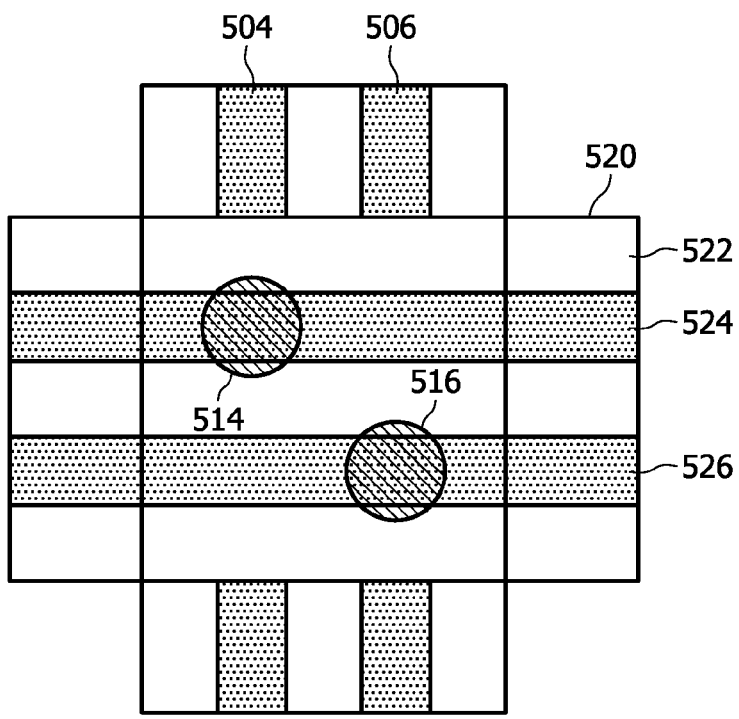
FIG. 6 shows the application of a further conductive tape to a connector applied to a conductive tape

FIG. 6 shows the application of a further conductive tape 520. Conductive tape 520 has insulating layer 522, first conducting layer 524 and second conducting layer 526. Following the application of the first and second perturbations, an electrical connection is established between first conducting layer 504 of conductive tape 500 and first conducting layer 524 of conductive tape 520 through first conductive region 514 of connector 510. Similarly, an electrical connection is established between second conducting layer 506 of conductive tape 500 and second conducting layer 526 of conductive tape 520 through second conductive region 516 of connector 510.

Figure 7:
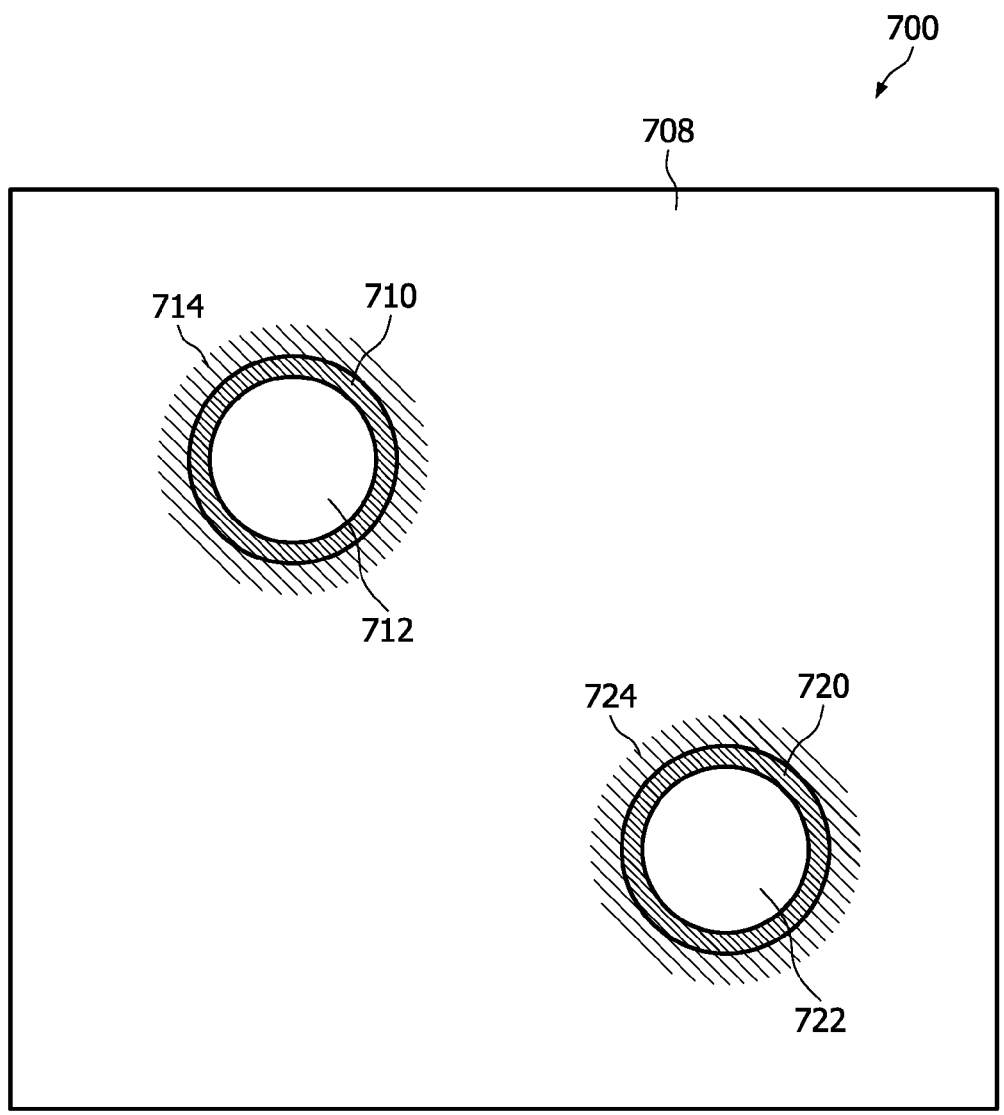
FIG. 7 shows a connector.

FIG. 7 shows connector 700. Connector 700 has first conductive region 710 and second conductive region 720. First conductive region 710 and second conductive region are held in place by insulating material 708. First connection region 712 is located over first conduction region 710. First connection region 712 comprises a first plurality of cells; the first plurality of cells contains an etching agent. The etching agent is released from the first plurality of cells when the first perturbation is applied. First connection region 712 further comprises a second plurality of cells containing a conductive epoxy, which is released when the second perturbation is applied. Region 714 may contain a further plurality of cells containing an insulator, which is released when a third perturbation is applied. Similarly, second connection region 722 is located over second conduction region 720. Second connection region 722 comprises a first plurality of cells; the first plurality of cells contains an etching agent. The etching agent is released from the first plurality of cells when the first perturbation is applied. Second connection region 722 further comprises a second plurality of cells containing a conductive epoxy, which is released when the second perturbation is applied. Region 724 may contain a further plurality of cells containing an insulator, which is released when a third perturbation is applied.

Alternatively, the first and second connection regions may be located on the periphery of the first and second conductive regions respectively in the locations of regions 714 and 724.

The pluralities of cells containing the etching agent, the conductive epoxy and the insulating material may be located on both the top and the bottom of connector 700 to allow connections between conductive tapes as shown in FIG. 6. Alternatively, the pluralities of cells may only be located on a single side of the connector and the connector may be used to make a connection between a conductive tape and an LED lighting device for example.

The connector may be integrated into a device such as a lighting device, a power supply, a display, a switch, and an actuator or similar. When mounted on a wall with a conductive tape embedded within, the connector could be used to establish a connection between the device and the conductive tape.

The filling capacity of the cells may be optimized for the functionality. The plurality of cells containing the etching agent may contain an amount sufficient to open the defined area of the insulating layer of the conductive tape, but not to destroy the isolating area around the conductive layer. The cells containing the conductive epoxy may contain an amount sufficient to fill the area that is opened, but not an amount so great that a short circuit is made.

The etching agent and the conductive epoxy contained within the cells may become active after components of the etching agent or epoxy are mixed. The etching agent may for example be made up of two components, the two components being contained within different cells or micro bubbles. Once the cells or burst due to the application of pressure or temperature, the two components would then mix and thus create an active etching agent. Similarly, the conductive epoxy may comprise two components, contained within separate cells, and the two components would then be mixed once they are released by the application of pressure or temperature.

FIG. 8 shows a method 800 of establishing an electrical connection between a conductive tape and a second conductive tape. In step 802, a connector is placed over the conductive tape. In step 804, a second conductive tape is placed over the connector. In step 806, a first pressure is applied. The application of the first pressure causes the first plurality of cells in the connection regions of the connector to release an etching agent. The etching agent removes the insulating layer from a portion of the conductive tape and a portion of the second conductive tape. In step 808, a second pressure is applied. The second pressure is a higher pressure than the first pressure. The second pressure causes the second plurality of cells to release a conductive epoxy which establishes an electrical connection between a conducting layer of the conductive tape and a conductive region of the connector. The second pressure also releases a conductive epoxy which establishes an electrical connection between the conductive region of the connector and a conducting layer of the second conductive tape. A third pressure may be applied. The application of the third pressure may secure and make the interface stable. Alternatively, the application of the pressure temperature may release an insulating material to protect and insulate the interface established between the conductive tapes.

The insulating material may be chosen so that the connection is surrounded by a waterproof layer once the insulating material is in place. This has the advantage that substances such as paint or wallpaper paste can be applied to the connector without affecting the electrical connection.

The time between the first, second and third perturbation may be optimized for standard process parameters, for measured parameters (such as room temperature, electrical resistance, pressing force), and for the number of interconnects, size of pads and type of pad. Different pads may be available for rough walls, for smooth wall, with a ring structure as in FIG. 7 or with multiple ring structures in one pad or other special geometries of the cells containing the etching agent, the conductive epoxy and the isolating material. Possible configurations include a mixture of etching and conductive cells a ring containing cells having the isolating material contained therein. The cells may be arranged in star, line, or other shape. The cells containing the conductive epoxy may be surrounded by those containing the etching agent.

FIG. 9 shows a method 900 of establishing an electrical connection between a conductive tape and a second conductive tape. In step 902, a connector is placed over the conductive tape. In step 904, a second conductive tape is placed over the connector. In step 906, a first temperature is applied. The application of the first pressure causes the release of an etching agent from the fist plurality of cells in the connector. The etching agent removes a portion of the insulating layer both the conductive tape and the second conductive tape. In step 908, a second temperature is applied. The second temperature is higher than the first temperature. The application of the second temperature causes the release of the conductive epoxy close to the conductive regions of the connector. The conductive epoxy establishes an electrical connection between the conductive regions of the connector and the conducting layers of the conductive tape and the second conductive tape. In step 910, a third temperature is applied. The application of the third temperature may secure and make the interface stable. Alternatively, the application of the third temperature may release an insulating material to protect and insulate the interface established between the conductive tapes.

The application of the pressures or temperatures as the various perturbations described above may be undertaken using a tool. The tool comprises means for applying at least a first perturbation. The tool may be operable to apply a pressure or a force of the correct magnitude to release the etching agent. In the example considered above in which the electrical connection is established using needles, the tool may be operated to apply a force great enough such that the needles penetrate the insulating layer of a conductive tape but do not pass through the foil making up the conducting layers.

The tool may further comprise means to apply a second perturbation. The tool may include an electrical heating element in order to generate first and second temperatures. The tool may further comprise means to measure an electrical property of the connection, such as the resistance or conductance. This may be achieved by connecting the tool to both of the elements being connected. This would allow an operator of the tool to be certain that the perturbations had been applied at the correct level for the correct amount of time. Further, this would allow loose connections, due to dust or other objects being between conductive tape and the connector to be identified. The tool may further be operable to apply a third perturbation.

The tool may have a surface optimized to support a homogenous distribution of the etching liquid, conductive epoxy, or insulating material.

The parameters such as the first, second and third perturbation may be programmable or defined. A user may be able to vary the parameters to account for factors such as the roughness of a wall, the type of connector, the type and construction of the tape, and the room temperature. Variables such as the time interval between the perturbations may be defined, or user programmable.

LIST OF REFERENCE NUMERALS 100 conductive tape
102 insulating layer
104 first conducting layer
106 second conducting layer
200 connector
204 first conductive region
206 second conductive region
208 insulating material
300 method
302 place connector over conductive tape
304 apply first perturbation
400 method
402 place connector over conductive tape
404 place second conductive tape over connector
406 apply first perturbation
408 apply second perturbation
500 conductive tape
502 insulating layer
504 first conducting layer
506 second conducting layer
510 connector
514 first conductive region
516 second conductive region
518 insulating material
520 conductive tape
522 insulating layer 524 first conducting layer
526 second conducting layer
700 connector
708 insulating material
710 first conductive region
712 first connection region
714 region (isolation)
720 second conductive region
722 second connection region
724 region (isolation)
800 method
802 place connector over conductive tape
804 place second conductive tape over connector
806 apply first pressure
808 apply second pressure
900 method
902 place connector over conductive tape
904 place second conductive tape over connector
906 apply first temperature
908 apply second temperature
910 apply third temperature

The invention claimed is:

1. A connector for establishing an electrical connection with a conductive tape, the conductive tape comprising at least a first conducting layer and an insulating layer, the connector comprising:
a first conductive region; and
a first connection region adapted to establish an electrical connection between the first conducting layer of the conductive tape and the first conductive region when a perturbation is applied, wherein the first connection region comprises at least one first cell having a first release threshold at a first degree of the perturbation, wherein the first connection region comprises at least one second cell having a second release threshold at a second degree of the perturbation that is higher than the first degree of the perturbation, and wherein the perturbation comprises at least one of:
applications of pressure, the second degree of the perturbation being an application of a greater pressure than the first degree of the perturbation or applications of temperature, the second degree of the perturbation being a greater temperature than the first degree of the perturbation.

2. The connector of claim 1, the first connection region having a plurality of needles, the perturbation being the application of a pressure causing plurality of needles to pierce the insulating layer of the conductive tape.

3. The connector of claim 1, wherein the at least one first cell is a first plurality of cells, the first plurality of cells having contained therein an etching agent.

4. The connector of claim 3, the first plurality of cells comprising cells containing a first component of the etching agent and cells containing a second component of the etching agent, wherein the etching agent becomes active upon the mixing of the first and second components.

5. The connector of claim 3, wherein the etching agent is released from the first plurality of cells upon the application of the first degree of the perturbation.

6. The connector of claim 3, wherein the at least one first cell is a second plurality of cells, the second plurality of cells having contained therein a conducting epoxy.

7. The connector of claim 6, the second plurality of cells comprising cells containing a first component of the conductive epoxy and cells containing a second component of the conductive epoxy, wherein the conductive epoxy becomes active upon the mixing of the first and second components.

8. The connector of claim 6, wherein the conductive epoxy is released from the second plurality of cells upon the application of the second degree of the perturbation.

9. The connector of claim 3, the first connection region further comprising a third plurality of cells having contained therein an insulating material.

10. The connector of claim 9, the insulating material being waterproof.

11. The connector of claim 1, the first connection region being on the periphery of the first conductive region.

12. The connector of claim 1, the first connection region overlapping the first conduction region.

13. The connector of claim 1, further comprising a second conductive region and a second connection region.

* * * * *